(12) United States Patent
Ishii

(10) Patent No.: US 7,585,698 B2
(45) Date of Patent: Sep. 8, 2009

(54) THIN FILM TRANSISTOR HAVING OXIDE SEMICONDUCTOR LAYER AND MANUFACTURING METHOD THEREOF

(75) Inventor: Hiromitsu Ishii, Mitaka (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 12/190,102

(22) Filed: Aug. 12, 2008

(65) Prior Publication Data
US 2008/0305575 A1 Dec. 11, 2008

Related U.S. Application Data

(62) Division of application No. 11/448,633, filed on Jun. 7, 2006.

(30) Foreign Application Priority Data
Jun. 10, 2005 (JP) .............................. 2005-170348

(51) Int. Cl.
*H01L 21/00* (2006.01)
(52) U.S. Cl. .................. 438/104; 438/149; 438/161; 438/709; 438/718; 438/720; 438/722; 438/742; 438/754; 257/59; 257/72; 257/60; 257/411; 257/E21.46; 257/E27.131; 257/E27.132; 349/42; 349/43; 349/46
(58) Field of Classification Search .................. None
See application file for complete search history.

(56) References Cited

U.S. PATENT DOCUMENTS

| 5,243,202 | A | 9/1993 | Mori et al. |
| 6,042,752 | A | 3/2000 | Mitsui |
| 6,097,038 | A * | 8/2000 | Jinno ............................ 257/57 |
| 6,468,822 | B2 | 10/2002 | Maeda et al. |
| 6,825,891 | B2 | 11/2004 | Kurashina |
| 6,838,308 | B2 | 1/2005 | Haga |
| 6,919,235 | B1 | 7/2005 | Yamazaki et al. |
| 7,141,180 | B2 | 11/2006 | Park et al. |

(Continued)

FOREIGN PATENT DOCUMENTS

JP 5-67786 A 3/1993

(Continued)

OTHER PUBLICATIONS

Masuda, Saoshi et al, "Transparent thin film transistors using ZnO as an active channel layer and their electrical properties", Journal of Applied Physics, vol. 93, No. 3, Feb. 1, 2003, pp. 1624-1630.

(Continued)

*Primary Examiner*—Minh-Loan T Tran
*Assistant Examiner*—Fei Fei Yeung Lopez
(74) *Attorney, Agent, or Firm*—Frishauf, Holtz, Goodman & Chick, P.C.

(57) ABSTRACT

A thin film transistor has a semiconductor thin film including zinc oxide, a protection film formed on entirely the upper surface of the semiconductor thin film, a gate insulating film formed on the protection film, a gate electrode formed on the gate insulating film above the semiconductor thin film, and a source electrode and drain electrode formed under the semiconductor thin film so as to be electrically connected to the semiconductor thin film.

19 Claims, 16 Drawing Sheets

U.S. PATENT DOCUMENTS

| | | |
|---|---|---|
| 7,256,465 B2 | 8/2007 | Li et al. |
| 2002/0063825 A1 | 5/2002 | Sakurai et al. |
| 2002/0117736 A1 | 8/2002 | Yamazaki et al. |
| 2002/0154252 A1 | 10/2002 | Toyota et al. |
| 2003/0047785 A1* | 3/2003 | Kawasaki et al. ........... 257/350 |
| 2005/0116225 A1 | 6/2005 | Yamazaki et al. |
| 2006/0292839 A1 | 12/2006 | Yi et al. |

FOREIGN PATENT DOCUMENTS

| | | |
|---|---|---|
| JP | 2000-058839 A | 2/2000 |
| JP | 2003-037268 A | 2/2003 |
| JP | 2004-311702 A | 11/2004 |
| JP | 2005-033172 A | 2/2005 |
| KR | 1999-0040629 A | 6/1999 |

OTHER PUBLICATIONS

Kwon, Y., et al "Enhancement-mode thin-film field-effect transistor using phosphorus-doped (Zn,Mg)O channel", Applied Physics Letters, vol. 84, No. 14, Apr. 5, 2004, pp. 2685-2687.

Korean Office Action dated Apr. 9, 2009 (4 pages), and English translation thereof (5 pages), issued in counterpart Korean Application Serial No. 10-2007-7019261.

* cited by examiner

THIN FILM TRANSISTOR HAVING OXIDE SEMICONDUCTOR LAYER AND MANUFACTURING METHOD THEREOF

CROSS-REFERENCE TO RELATED APPLICATION

The present application is a Divisional application of U.S. application Ser. No. 11/448,633 filed Jun. 7, 2006, which is incorporated herein by reference.

BACKGROUND OF THE INVENTION

1. Field of the Invention

The present invention relates to a thin film transistor, and particularly relates to a thin film transistor suitable for a case where its semiconductor layer is an oxide semiconductor layer.

2. Description of the Related Art

As described in Unexamined Japanese Patent Application KOKAI Publication No. H5-67786, an inversely staggered structure is generally adopted for a thin film transistor used as a switching element of an active matrix liquid crystal display device. A thin film transistor of this structure is constructed such that a gate electrode is formed on an insulating substrate, a gate insulating film is formed on the upper surface of the gate electrode and insulating substrate, a semiconductor thin film made of intrinsic amorphous silicon is formed on the upper surface of the gate insulating film that is on the gate electrode, a channel protection film is formed on the center portion of the upper surface of the semiconductor thin film, ohmic contact layers made of n-type amorphous silicon are formed on both sides of the upper surface of the channel protection film and on the semiconductor thin film at both sides of the channel protection film, and source and drain electrodes are formed on the upper surfaces of the respective ohmic contact layers.

Recently, there is an idea of using zinc oxide (ZnO) instead of amorphous silicon, because a higher mobility than that of amorphous silicon can be obtained from zinc oxide. In a case where a zinc oxide film is formed by CVD (Chemical Vapor Deposition), the film property is unstable in the initial state. Therefore, if the inversely staggered structure is adopted, the zinc oxide film in this unfavorable initial state is placed opposite to the gate electrode, i.e., the zinc oxide film in the unfavorable state forms the channel region, making it harder to achieve excellent properties as a thin film transistor. A cure for this that is now being considered is to make a thin film transistor of a top gate type, in which the upper surface of the zinc oxide film serves as the channel region. A conceivable manufacturing method of a thin film transistor of the top gate type using zinc oxide is to, for example, form a semiconductor thin film forming layer made of intrinsic zinc oxide on a gate insulating film, form a patterned channel protection film made of silicon nitride on the upper surface of the semiconductor thin film forming layer, form an ohmic contact layer forming layer made of n-type zinc oxide on the upper surface of the semiconductor thin film forming layer including the channel protection film, sequentially pattern the ohmic contact layer forming layer and the semiconductor thin film forming layer to form an ohmic contact layer and a semiconductor thin film in the device area, and form source and drain electrodes by patterning on the upper surface of each patterned ohmic contact layer.

SUMMARY OF THE INVENTION

However, according to the above-described manufacturing method, it has been turned out that since zinc oxide easily melts in both acid and alkali and has a greatly low etching resistance, the semiconductor thin film and ohmic contact layer made of zinc oxide formed in the device area suffer a relatively large side etching in the manufacturing steps to follow, lowering the process accuracy.

Hence, an object of the present invention is to provide a thin film transistor formed with a fine process accuracy, and a manufacturing method thereof.

To achieve the above object, a thin film transistor according to the present invention comprises: a semiconductor thin film including zinc oxide; a protection film formed on entirely an upper surface of the semiconductor thin film; a gate insulating film formed on the protection film; a gate electrode formed on the gate insulating film above the semiconductor thin film; and a source electrode and a drain electrode formed under the semiconductor thin film so as to be electrically connected to the semiconductor thin film.

A manufacturing method of a thin film transistor according to the present invention comprises: continuously forming a semiconductor thin film forming film including zinc oxide and a protection film forming film; forming a protection film by etching the protection film forming film; forming a semiconductor thin film having a plan-view shape substantially same as that of the protection film, by etching the semiconductor thin film forming film by using the protection film as a mask; forming a gate insulating film which covers the protection film; and forming a gate electrode on the gate insulating film.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

First Embodiment

Figure 1:
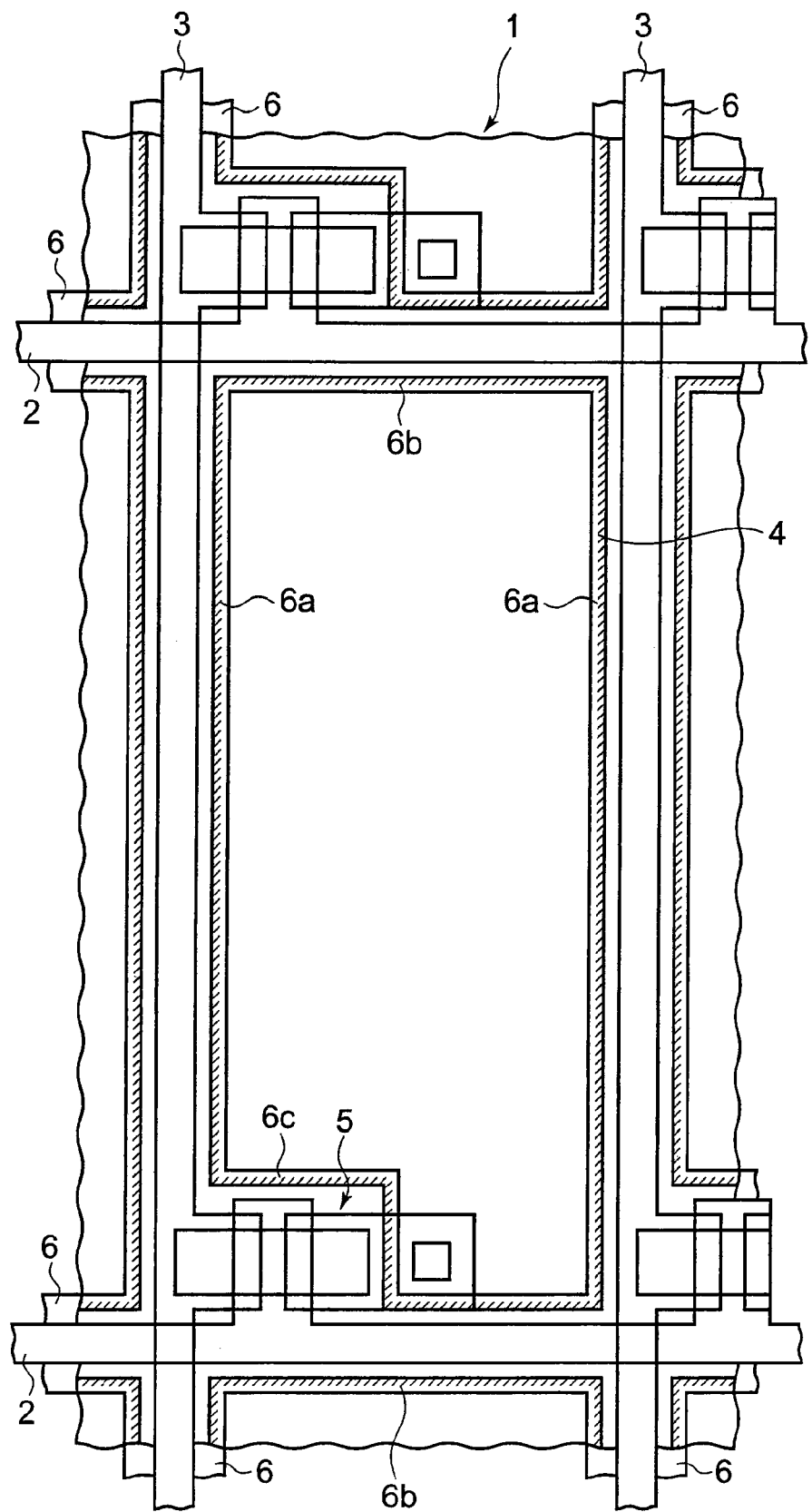
FIG. 1 is a see-through plan view of a principal part of a liquid crystal display device having a thin film transistor, as a first embodiment of the present invention.
Figure 2A:
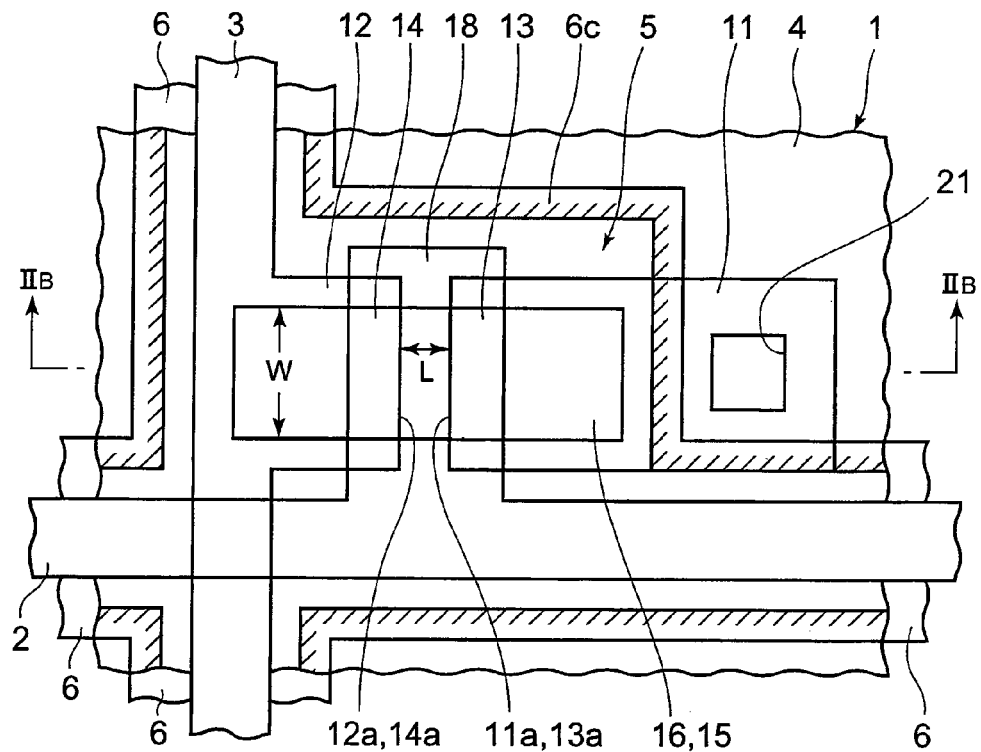
FIG. 2A is an expanded see-through plan view of a part of FIG. 1.
Figure 2B:
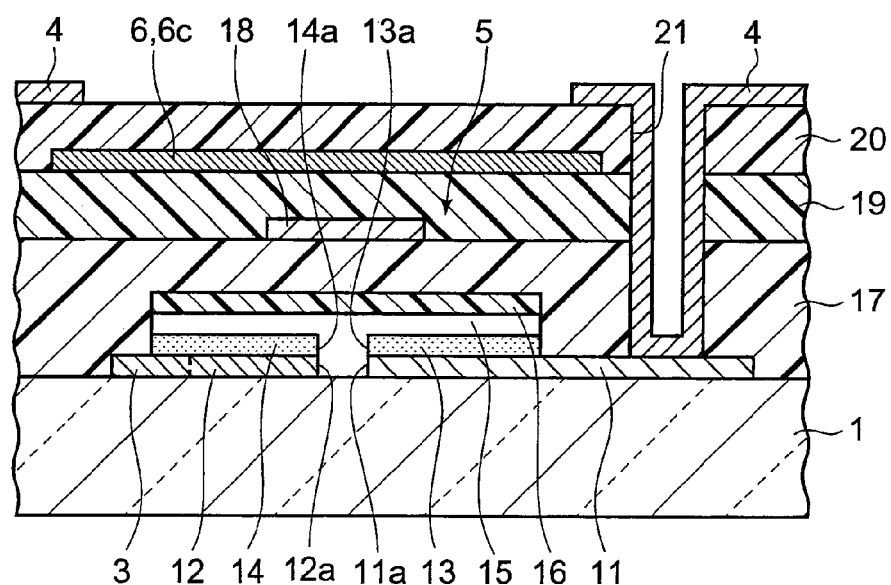
FIG. 2B is a cross-sectional view as sectioned along a line $II_B$-$II_B$ of FIG. 2A.

FIG. 1 shows a see-through plan view of the principal part of a liquid crystal display device comprising a thin film transistor as the first embodiment of the present invention. FIG. 2A shows an expanded see-through plan view of a part of FIG. 1, and FIG. 2B shows a cross sectional view as sectioned along line II$_B$-II$_B$ of FIG. 2A. The liquid crystal display device has a glass substrate 1.

Explanation will first be given with reference to FIG. 1. Scanning lines 2 and data lines 3 are formed in a matrix form on the upper surface of the glass substrate 1. A pixel electrode 4 is formed in the region surrounded by the scanning lines 2 and data lines 3, so as to be connected to a scanning line 2 and a data line 3 via a thin film transistor 5. A latticed auxiliary capacitor electrode 6 is formed in parallel with the scanning lines 2 and data lines 3. Note that hatching of angled short solid lines is used at the edges of the pixel electrode 4, throughout the drawings including FIG. 1, for the purposes of making the plan-view structure clear.

In FIG. 1, the pixel electrode 4 has its lower-left corner cut away, and the principal part of the thin film transistor 5 is arranged at the cut-away region. All the surrounding edges of the pixel electrode 4 overlap the auxiliary capacitor electrode 6 having the latticed shape formed therearound. The auxiliary capacitor electrode 6 having the latticed shape comprises a first auxiliary capacitor electrode portion 6a formed of a portion including a region overlapping the data line 3, a second auxiliary capacitor electrode portion 6b formed of a portion including a region overlapping the scanning line 2, and a third auxiliary capacitor electrode portion 6c formed of a portion including a region overlapping the principal part of the thin film transistor 5. In this case, as will be described later, the auxiliary capacitor electrode 6 is formed on a different layer from that of the scanning lines 2, and particularly, the first auxiliary capacitor electrode portion 6a of the auxiliary capacitor electrode 6 is formed to be insulated from the data line 3 and the pixel electrode 4 by insulating films respectively, in its thickness direction, i.e., in the direction vertical to the drawing sheet of FIG. 1.

The width of the first auxiliary capacitor electrode portion 6a is larger than the width of the data line 3 by some degree. This enables the first auxiliary capacitor electrode portion 6a to securely cover the data line 3 so as not to permit the data line 3 to directly face the pixel electrode 4 even if a positional displacement occurs in a direction perpendicular to the direction in which the data line 3 extends. The first auxiliary capacitor electrode 6a is arranged almost all over the area where the data lines 3 are arranged. This makes the first auxiliary capacitor electrode portion 6a securely overlap the left and right edges of the pixel electrode 4 even if the first auxiliary capacitor electrode portion 6a is positionally displaced with respect to the pixel electrode 4 in a direction parallel with the data lines 3, making it possible to securely prevent fluctuation in the auxiliary capacitance due to positioning misplacement in this direction.

The width of the second auxiliary capacitor electrode portion 6b is larger than the width of the scanning line 2 by some degree. This makes the second auxiliary capacitor electrode portion 6b securely cover the scanning line 2 even if a positional displacement occurs in a direction perpendicular to the direction in which the scanning line 2 extends. The second auxiliary capacitor electrode portion 6b is arranged almost all over the area where the scanning lines 2 are arranged. This makes the second auxiliary capacitor electrode portion 6b securely overlap the upper and lower edges of the pixel electrode 4 even if the second auxiliary capacitor electrode portion 6b is positionally displaced with respect to the pixel electrode 4 in a direction parallel with the scanning lines 2, making it possible to securely prevent fluctuation in the auxiliary capacitance due to positional displacement in this direction.

Next, the specific structure of the present liquid crystal display device will be explained with reference to FIG. 2A and FIG. 2B. A source electrode 11, a drain electrode 12, and the data line 3 connected to the drain electrode 12, which are made of aluminum, chromium, ITO, or the like, are formed at predetermined positions on the upper surface of the glass substrate 1. An ohmic contact layer 13 on one side made of n type zinc oxide is formed on the upper surface of the source electrode 11 at a side closer to the drain electrode 12. An ohmic contact layer 14 on the other side made of n type zinc oxide is formed on the upper surface of the drain electrode 12 including a part of the data line 3 at a side closer to the source electrode 11. End surfaces 13a and 14a of the ohmic contact layers 13 and 14 facing each other have the same shape as that of end surfaces 11a and 12a of the source electrode 11 and drain electrode 12 facing each other. Here, zinc oxide means not only ZnO, but also all ZnO-based materials including Mg, Cd, etc. in addition to ZnO.

A semiconductor thin film 15 made of intrinsic zinc oxide is formed on entirely the two ohmic contact layers 13 and 14, and on the upper surface of the glass substrate 1 that appears between the contact layers 13 and 14. A protection film 16 made of silicon nitride is formed on the entire surface of the semiconductor thin film 15. The semiconductor thin film 15 and the protection film 16 have the same plan-view shape, as shown in FIG. 2A. The surrounding end surfaces of the two ohmic contact layers 13 and 14, except the end surfaces 13a and 14a facing each other, have the same shape as that of the surrounding end surfaces of the semiconductor thin film 15 and protection film 16. The interval between the end surfaces 13a and 14a of the two ohmic contact layers 13 and 14 is the channel length L, and the dimension of the ohmic contact layers 13 and 14 in the direction perpendicular to the channel length L is the channel width W.

An insulating film 17 made of silicon nitride is formed on the upper surface of the glass substrate 1, including on the protection film 16, the source electrode 11, and the data line 3. A gate electrode 18 and the scanning line 2 connected to the gate electrode 18, which are made of aluminum, chromium, ITO, or the like are formed at predetermined positions on the upper surface of the insulating film 17.

The source electrode 11, the drain electrode 12, the ohmic contact layers 13 and 14, the semiconductor thin film 15, the protection film 16, the insulating film 17, and the gate electrode 18 form the thin film transistor 5 of a top gate structure. In this case, the gate insulating film of the thin film transistor 5 is formed by the protection film 16 and the insulating film 17.

An upper insulating film 19 made of silicon nitride is formed on the upper surface of the insulating film 17 including the gate electrode 18 and the scanning line 2. The auxiliary capacitor electrode 6 having a mostly latticed shape made of a light blocking metal such as aluminum, chromium, etc. is formed at a predetermined position on the upper surface of the upper insulating film 19. An overcoat film 20 made of silicon nitride is formed on the upper surface of the upper insulating film 19 including the auxiliary capacitor electrode 6. A contact hole 21 is formed in the overcoat film 20, the upper insulating film 19, and the insulating film 17 at a portion corresponding to predetermined position on the source electrode 11. The pixel electrode 4 made of a transparent conductive material such as ITO, etc. is formed at a predetermined position on the upper surface of the overcoat film 20, so as to be connected to the source electrode 11 through the contact hole 21.

Figure 3A:
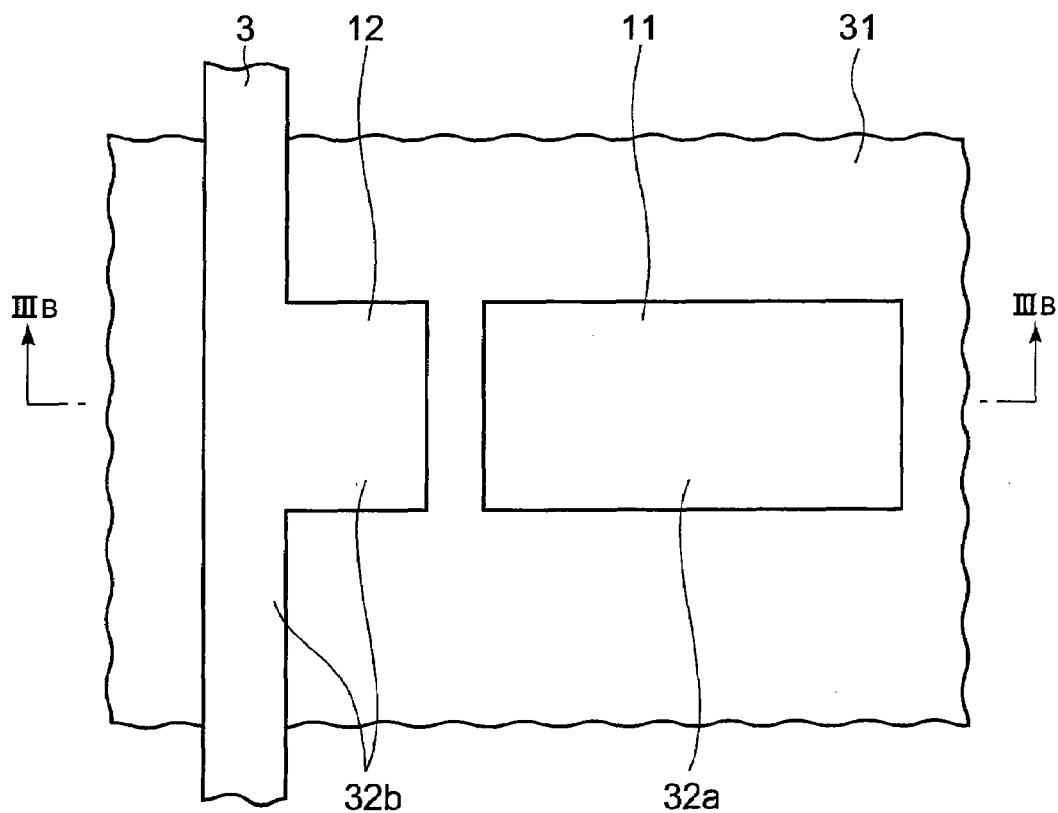
FIG. 3A is a see-through plan view showing an earlier step of a process for manufacturing the part of the thin film transistor shown in FIGS. 2A and 2B.
Figure 3B:
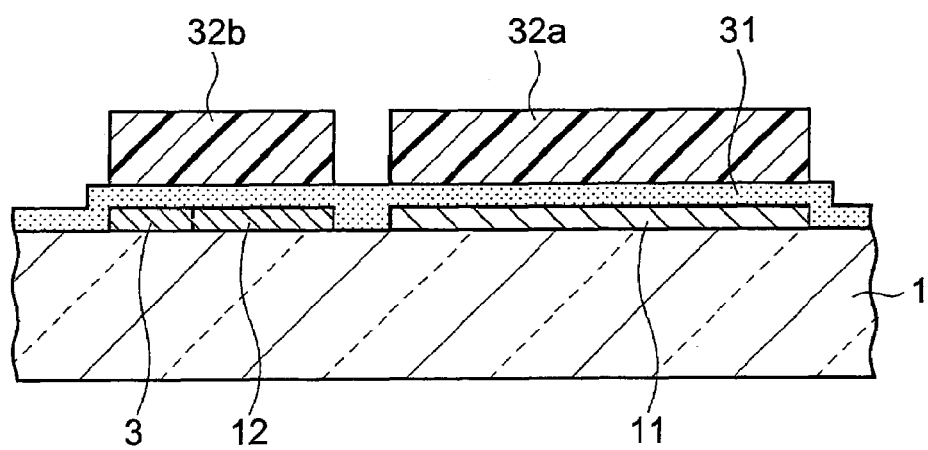
FIG. 3B is a cross-sectional view as sectioned along a line $III_B$-$III_B$ of FIG. 3A.

Next, an example of a manufacturing method of the region around the thin film transistor 5 in the present liquid crystal display will be explained. First, as shown in FIG. 3A and FIG. 3B, the source electrode 11, the drain electrode 12, and the data line connected to the drain electrode 12 are formed on the respective predetermined positions on the upper surface of the glass substrate 1, by photolithographically patterning a metal film made of aluminum, chromium, ITO, or the like formed by sputtering.

Next, a first ohmic contact layer forming layer 31 made of n type zinc oxide is formed on the upper surface of the glass substrate 1, including on the source electrode 11, the drain electrode 12, and the data line 3, by facing-target sputtering. In this case, the first ohmic contact layer forming layer 31 can be formed by reactive sputtering using oxygen gas, and using indium and zinc as the targets, or gallium and zinc as the targets. Alternatively, indium-zinc oxide (InZnO) or gallium-zinc oxide (GaZnO) may be used as the targets.

Next, resist patterns 32a and 32b are formed on respective predetermined positions on the upper surface of the first ohmic contact layer forming layer 31, by photolithography including rear exposure (exposure from the lower surface of the glass substrate 1). In this case, because of the rear exposure, one resist pattern 32a is formed on the source electrode 11, and the other resist pattern 32b is formed on the drain electrode 12 and the data line 3.

Figure 4A:
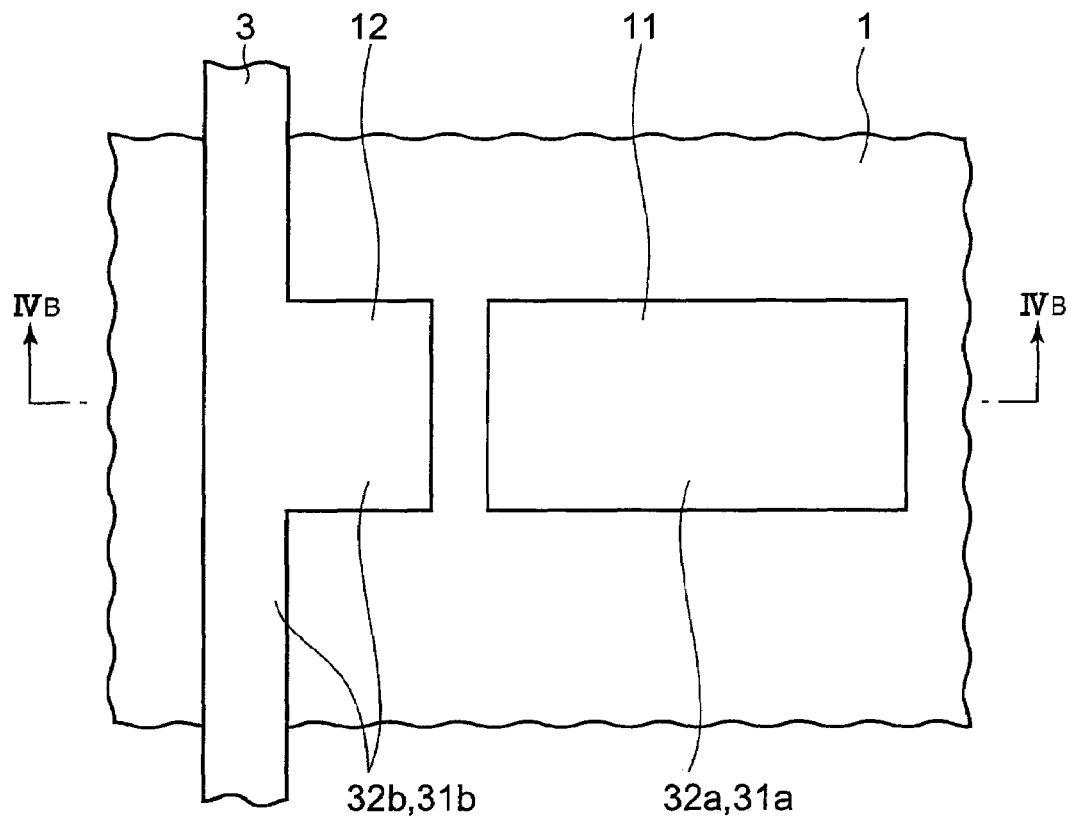
FIG. 4A is a see-through plan view of a step succeeding FIGS. 3A and 3B.
Figure 4B:
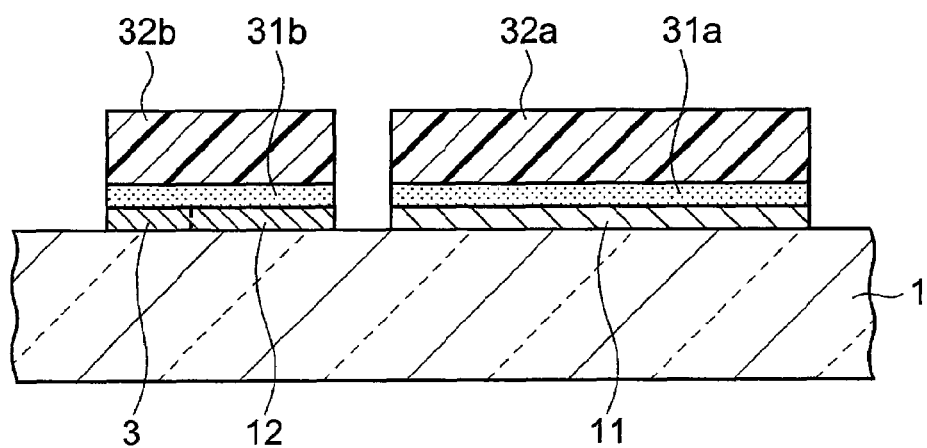
FIG. 4B is a cross-sectional view as sectioned along a line $IV_B$-$IV_B$ of FIG. 4A.

Next, the first ohmic contact layer forming layer 31 is etched by using the resist patterns 32a and 32b as masks, to form second ohmic contact layer forming layers 31a and 31b under the resist patterns 32a and 32b, as shown in FIG. 4A and FIG. 4B. In this case, an alkaline aqueous solution is used as the etching liquid for the first ohmic contact layer forming layer 31 made of n type zinc oxide. For example, an aqueous solution containing less than 30 wt % sodium hydroxide (NaOH), preferably, containing 2 to 10 wt % sodium hydroxide. The temperature of the etching liquid is 5 to 40° C., preferably, a room temperature (22 to 23° C.).

In a case where an aqueous solution containing 5 wt % sodium hydroxide (NaOH) (whose temperature is a room temperature (22 to 23° C.)) was used, the etching rate was about 80 nm/minute. When taking the etching process controllability into consideration, a too high etching rate makes it difficult to control the etching end due to factors such as variations in film thickness, density, etc., while, needless to say, a too low etching rate decreases the productivity. Hence, it is generally said that the etching rate should preferably be 100 to 200 nm/minute. Thus, it can be said that the aqueous solution containing 5 wt % sodium hydroxide (NaOH), which achieved the etching rate of about 80 nm/minute is within a range of satisfaction.

However, the density of sodium may be increased to further improve the manufacturing efficiency. In a case where an etching liquid such as phosphoric acid aqueous solution, that has a high etching rate, is used, the liquid needs to have a very low density of about 0.05% with a concern for the etching process controllability. However, such a low density liquid is quick to deteriorate while it is being used, causing the same problem of process control difficulties. Hence, if a sodium hydroxide aqueous solution is used, the aqueous solution can be less than 30 wt %, preferably about 2 to 10 wt %, proving its usefulness in this respect. In a case where the amount of side etching caused in the first ohmic contact layer forming layer 31 by wet etching affects the interval between the end surfaces 13a and 14a of the ohmic contact layers 13 and 14, i.e., the channel length L, dry etching may be employed.

Next, the resist patterns 32a and 32b are separated by using a resist separation liquid. Here, the inventor has confirmed that the resist separation can finely be performed even by using, as the resist separation liquid, a liquid showing neither acidity nor alkalinity (including no electrolyte), such as a single organic solvent (for example, dimethylsulfoxide (DMSO)). In this case, the resist separation liquid etches the second ohmic contact layer forming layers 31a and 31b made of n type zinc oxide, but the amount of accompanying side etching is not so large, not to an extent that the channel length L would be affected. Furthermore, the resist etching liquid also etches out the top surfaces of the second ohmic contact layer forming layers 31a and 31b, but there will be no trouble because a film thinning of the ohmic contact layers will not influence the properties of the thin film transistor. ITO may be used instead of n type zinc oxide, as the ohmic contact layers.

Figure 5A:
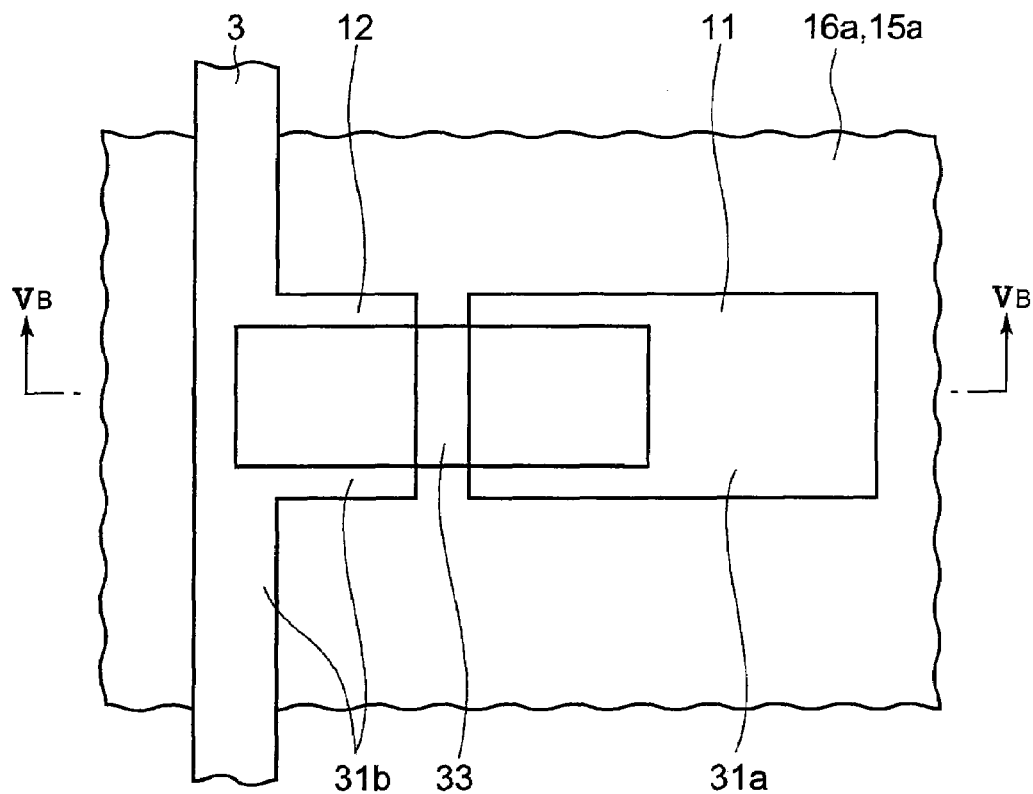
FIG. 5A is a see-through plan view of a step succeeding FIGS. 4A and 4B.
Figure 5B:
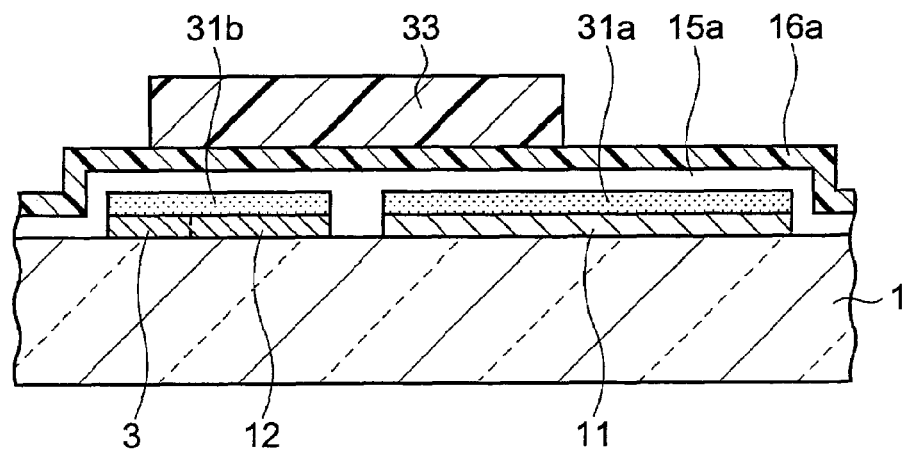
FIG. 5B is a cross-sectional view as sectioned along a line $V_B$-$V_B$ of FIG. 5A.

Next, a semiconductor thin film forming film 15a made of intrinsic zinc oxide and a protection film forming film 16a made of silicon nitride are continuously formed by plasma CVD on the upper surface of the glass substrate 1, including on the second ohmic contact layer forming layers 31a and 31b, as shown in FIG. 5A and FIG. 5B. Next, a resist pattern 33 for forming a device area is formed by photolithography at a predetermined position on the upper surface of the protection film forming film 16a.

Figure 6A:
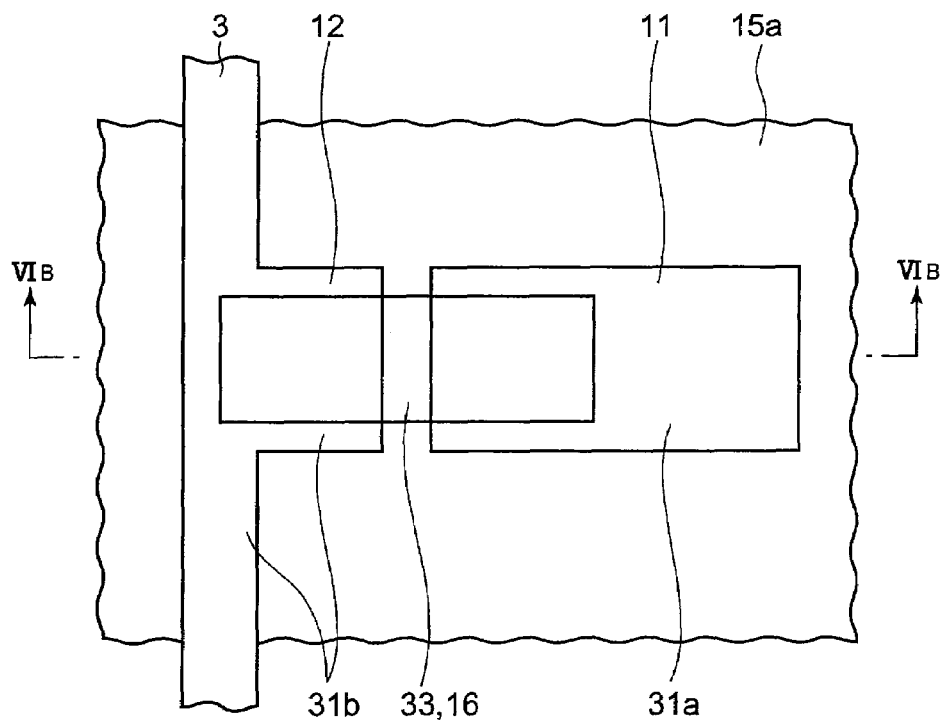
FIG. 6A is a see-through plan view of a step succeeding FIGS. 5A and 5B.
Figure 6B:
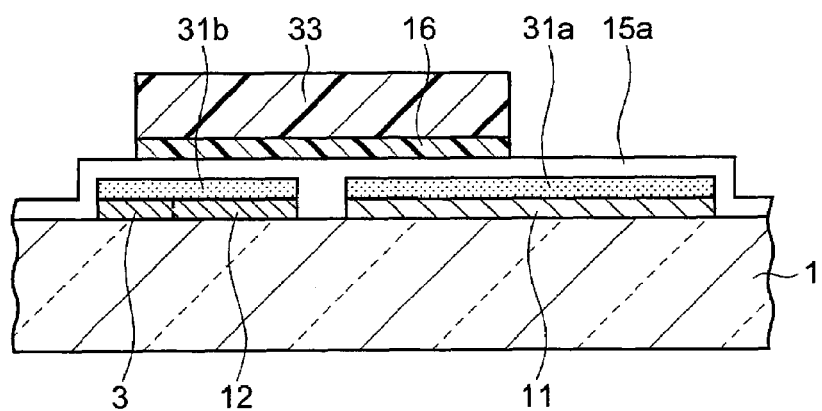
FIG. 6B is a cross-sectional view as sectioned along a line $VI_B$-$VI_B$ of FIG. 6A.

Next, the protection film forming film 16a is etched by using the resist pattern 33 as a mask, to form the protection film 16 under the resist pattern 33 as shown in FIG. 6A and FIG. 6B. In this case, the surface of the semiconductor thin film forming film 15a is exposed, except under the resist pattern 33. Hence, reactive plasma etching (dry etching) using sulferhexafluoride ($SF_6$) is preferable as the etching method for the protection film forming film 16a made of silicon nitride, because this etching method has a high etching rate and because it is needed to leave the semiconductor thin film forming film 15a made of intrinsic zinc oxide the least eroded.

Next, the resist pattern 33 is separated by using a resist separation liquid. In this case, the surface of the semiconductor thin film forming film 15a except under the protection film 16 is exposed to the resist separation liquid, but no trouble will occur since the exposed surface is not the device area. That is, the properties of the thin film transistor will be greatly influenced if the channel region experiences a side etching or the upper surface of the channel region undergoes etching unlike the above-described case of forming the ohmic contact layers, but the semiconductor thin film forming film 15a under the protection film 16 is protected by the protection film 16. In this case, a resist separation liquid showing neither acidity nor alkalinity (including no electrolyte), for example, a single organic solvent (for example, dimethylsulfoxide (DMSO)) may be used.

Figure 7A:
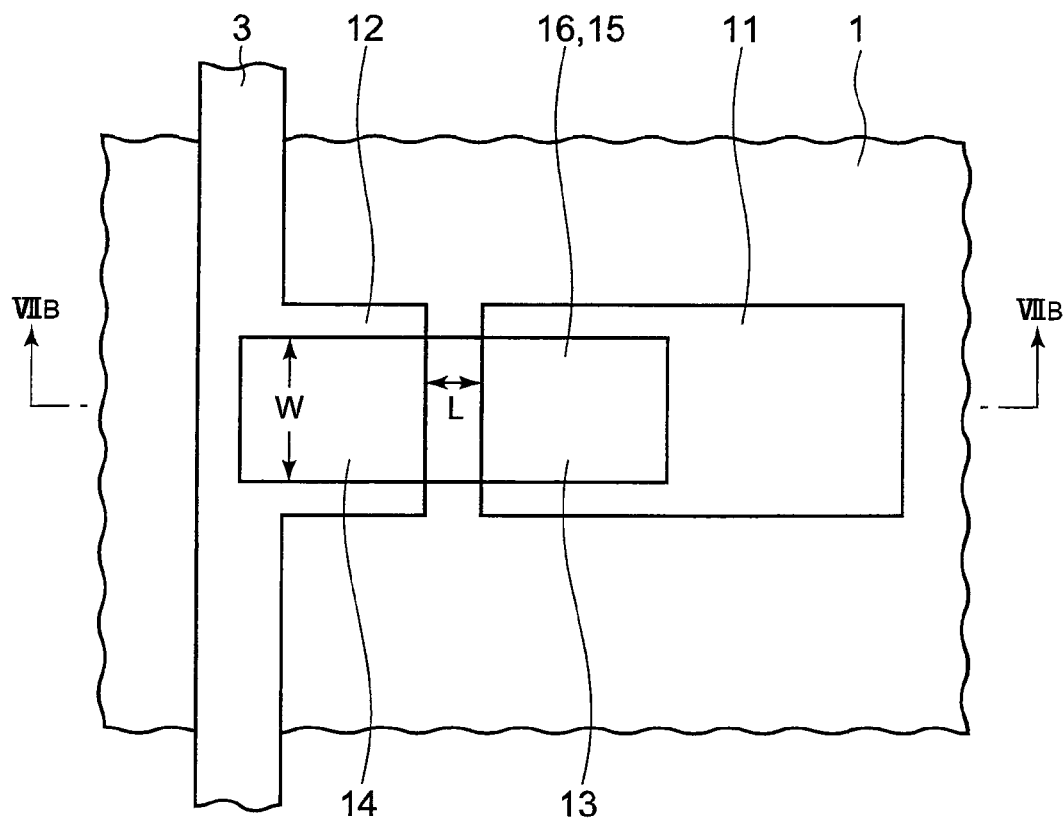
FIG. 7A is a see-through plan view of a step succeeding FIGS. 6A and 6B.
Figure 7B:
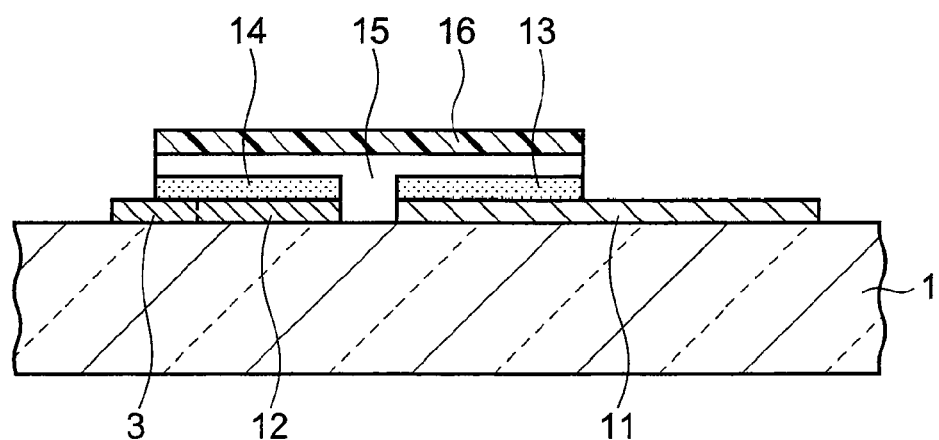
FIG. 7B is a cross-sectional view as sectioned along a line $VII_B$-$VII_B$ of FIG. 7A.

Next, the semiconductor thin film forming film 15a and the second ohmic contact layer forming layers 31a and 31b are continuously etched by using the protection film 16 as a mask, to form the semiconductor thin film 15 under the protection film 16, and both the ohmic contact layers 13 and 14 under the semiconductor thin film 15, as shown in FIG. 7A and FIG. 7B.

In this case, since the semiconductor thin film forming film 15a and the second ohmic contact layer forming layers 31a and 31b are made of intrinsic zinc oxide and n type zinc oxide, the process controllability will be fine if the above-described sodium hydroxide aqueous solution is used as the etching liquid. Here, the interval between the two ohmic contact layers 13 and 14 is the channel length L, and the dimension of the ohmic contact layers 13 and 14 in the direction perpendicular to the channel length L is the channel width W.

In the above description, it is after the resist pattern 33 is separated when the semiconductor thin film forming film 15a and the second ohmic contact layer forming layers 31a and 31b are etched by using the protection film 16 as the mask. However, the resist pattern 33 may be separated after the semiconductor thin film forming film 15a and the ohmic contact layer forming layers 31a and 31b are etched.

Figure 8A:
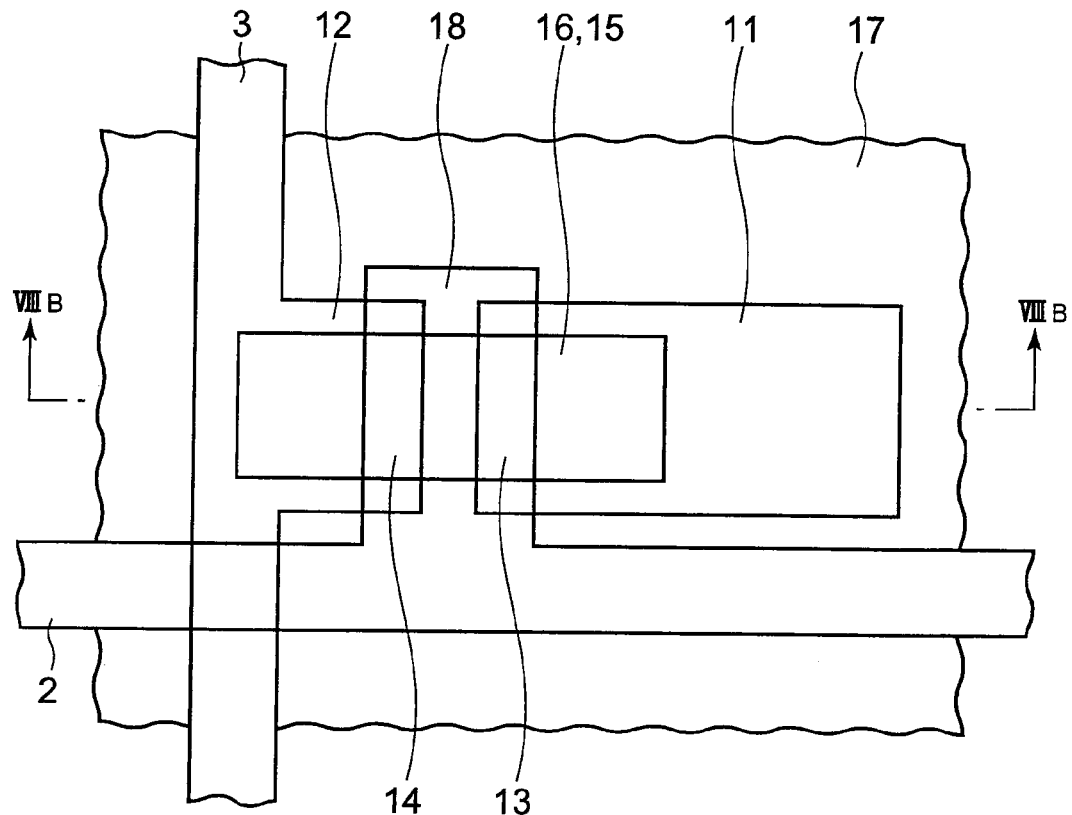
FIG. 8A is a see-through plan view of a step succeeding FIGS. 7A and 7B.
Figure 8B:
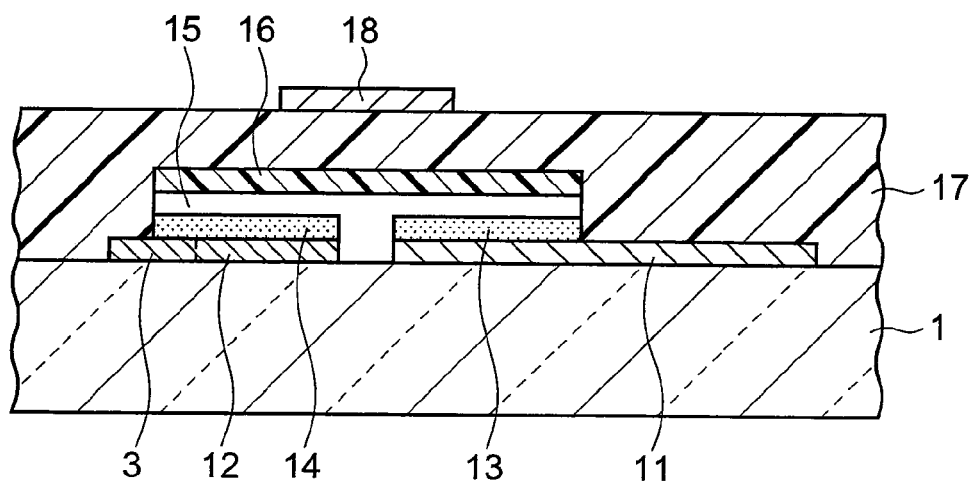
FIG. 8B is a cross-sectional view as sectioned along a line VIII$_B$-VIII$_B$ of FIG. 8A.

Next, the insulating film 17 made of silicon nitride is formed by plasma CVD on the upper surface of the glass substrate 1, including on the protection film 16, the source electrode 11, and the data line 3, as shown in FIG. 8A and FIG. 8B. Next, the gate electrode 18 and the scanning line 2 connected to the gate electrode 18 are formed at predetermined positions on the upper surface of the insulating film 17, by photolithographically patterning a metal film made of chromium, aluminum, ITO, or the like formed by sputtering.

Figure 9A:
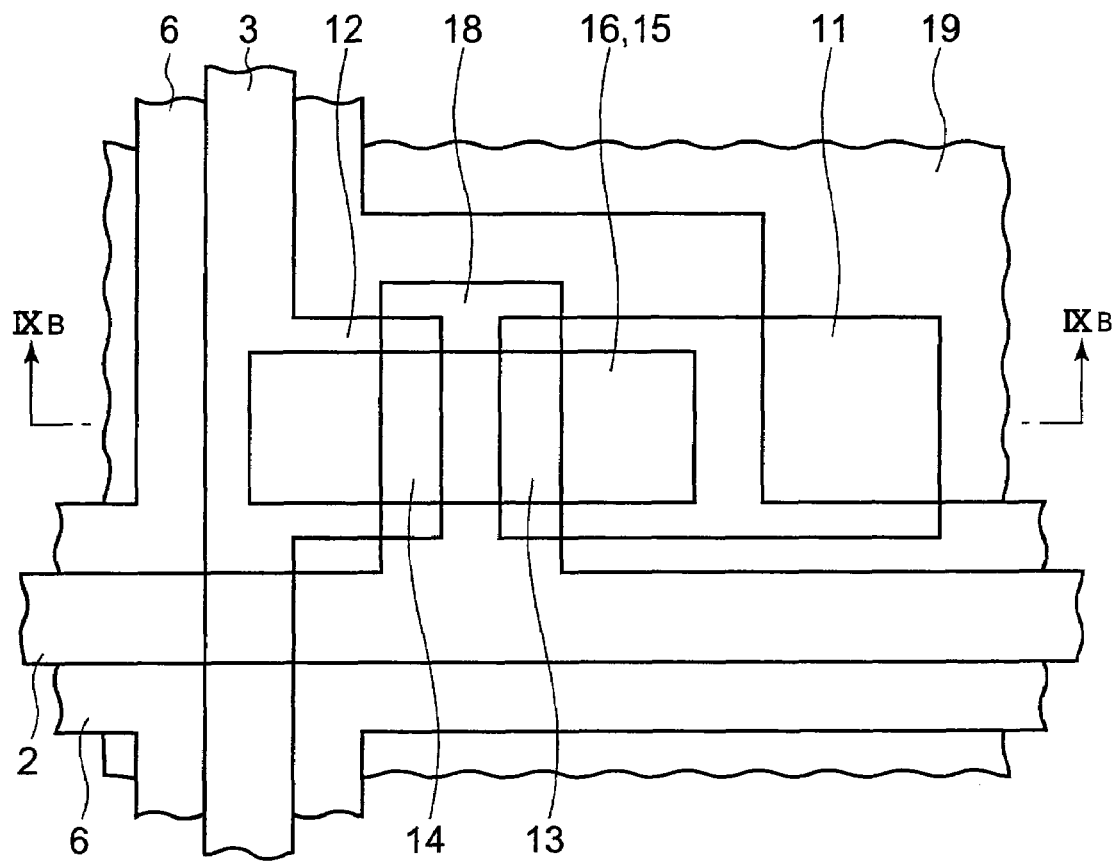
FIG. 9A is a see-through plan view of a step succeeding FIGS. 8A and 8B.
Figure 9B:
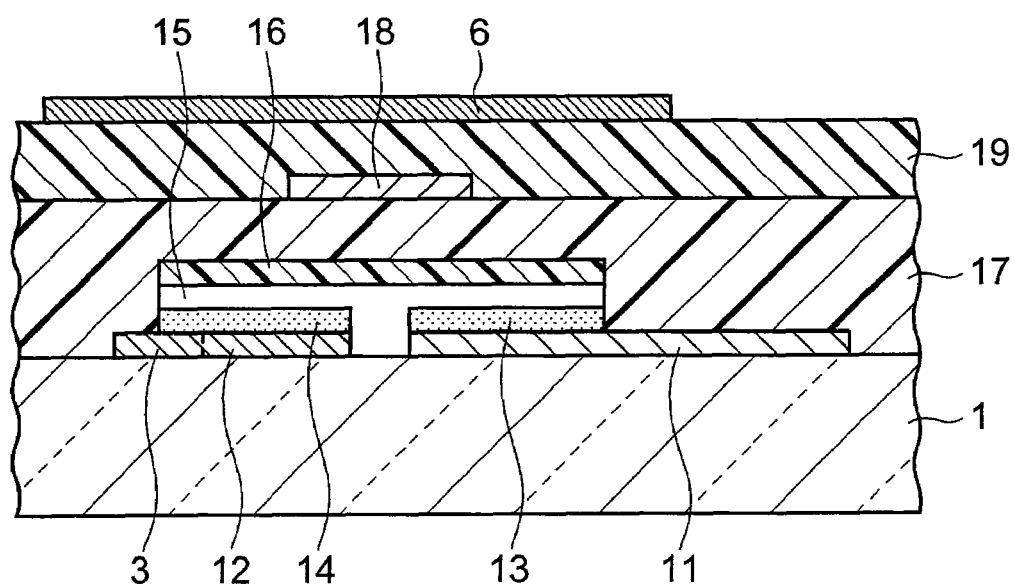
FIG. 9B is a cross-sectional view as sectioned along a line IX$_B$-IX$_B$ of FIG. 9A.

Next, the upper insulating film 19 made of silicon nitride is formed by plasma CVD on the upper surface of the insulating film 17 including the gate electrode 18 and the scanning line 2, as shown in FIG. 9A and FIG. 9B. Next, the auxiliary capacitor electrode 6 is formed at a predetermined position on the upper surface of the upper insulating film 19, by photolithographically patterning a light blocking metal film made of chromium, aluminum, or the like formed by sputtering.

Next, the overcoat film 20 made of silicon nitride is formed by plasma CVD on the upper surface of the upper insulating film 19 including the auxiliary capacitor electrode 6, as shown in FIG. 2A and FIG. 2B. Next, the contact hole 21 is formed by photolighography through the overcoat film 20, the upper insulating layer 19, and the insulating layer 17 sequentially, in a portion corresponding to a predetermined position on the source electrode 11. Next, the pixel electrode 4 is formed at a predetermined position on the upper surface of the overcoat film 20 so as to be connected to the source electrode 11 through the contact hole 21, by photolithographically patterning a pixel electrode forming film made of a transparent conductive material such as ITO formed by sputtering. Thus, the liquid crystal display device shown in FIG. 2A and FIG. 2B are obtained.

As described above, according to this manufacturing method, the resist pattern 33 for forming the protection film 16 on the upper surface of the semiconductor thin film forming film 15a is separated while a part of the semiconductor thin film forming film 15a is protected by the protection film 16, then the semiconductor thin film forming film 15a and the second ohmic contact layer forming layers 31a and 31b are continuously etched by using the protection film 16 as the mask, thereby to form the semiconductor thin film 15 under the protection film 16, and the ohmic contact layers 13 and 14 at both sides under the semiconductor thin film 15, with the protection film 16 left untouched on the entire upper surface of the semiconductor thin film 15. Accordingly, the process accuracy can be improved.

Further, in the thin film transistor 5 obtained by the above-described manufacturing method, since the interval between the two ohmic contact layers 13 and 14 is the channel length L and the dimension of the ohmic contact layers 13 and 14 in the direction perpendicular to the channel length L is the channel width W, this dimension can be made equal or similar to the dimension of a thin film transistor of a channel etch type having a bottom-gate structure, which leads to downsizing of the transistor.

Further, in the liquid crystal display device obtained by the above-described manufacturing method, since the first and second auxiliary capacitor electrode portions 6a and 6b having a larger width than that of the scanning line 2 and data line 3 are formed between the pixel electrode 4, and the scanning line 2 and the data line 3, it is possible to prevent occurrence of coupling capacitance between the pixel electrode 4, and the scanning line 2 and the data line 3 by these first and second auxiliary capacitor electrode portions 6a and 6b, thereby to ensure that no vertical crosstalk occurs and improve the display characteristics.

In the earlier manufacturing steps, it may be such that a source/drain electrode forming film and the first ohmic contact layer forming layer 31 are continuously formed on the upper surface of the glass substrate 1, the resist patterns 32a and 32b as shown in, for example, FIG. 3A and FIG. 3B are formed on the upper surface of the first ohmic contact layer forming layer 31, the first ohmic contact layer forming layer 31 and the source/drain electrode forming film are continuously etched by using the resist patterns 32a and 32b as masks, thereby to form the second ohmic contact layer forming layers 31a and 31b under the resist patterns 32a and 32b, and the source electrode 11 and the drain electrode 12 under the second ohmic contact layer forming layers 32a and 32b, as shown in, for example, FIG. 4A and FIG. 4B.

Second Embodiment

Figure 10A:
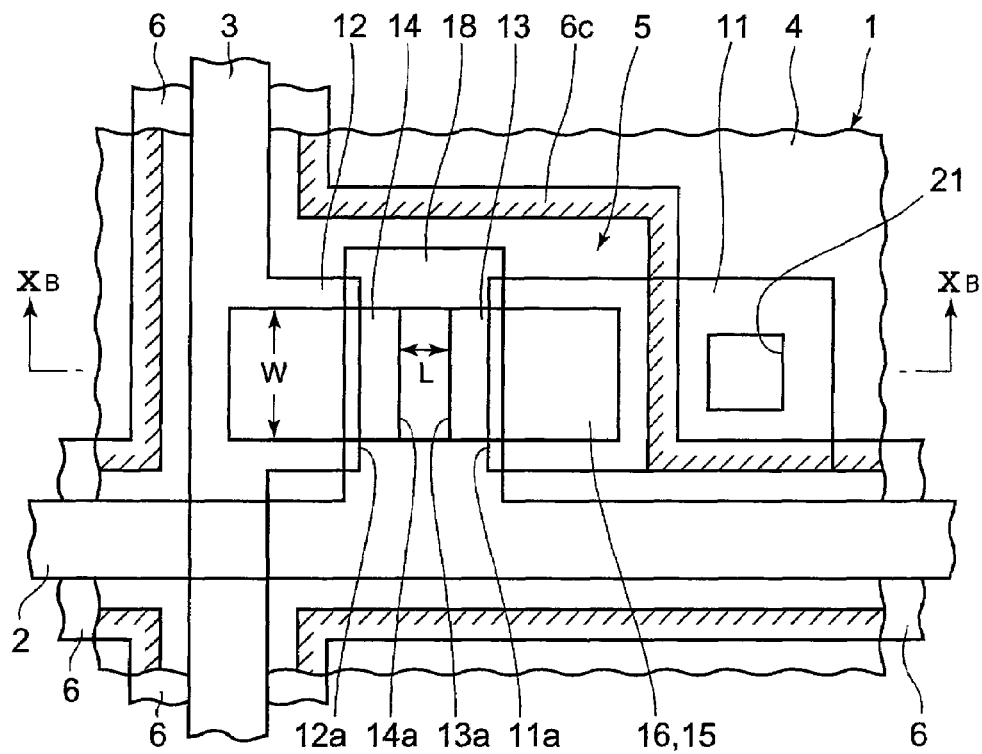
FIG. 10A is a see-through plan view of a principal part of a liquid crystal display device having a thin film transistor, as a second embodiment of the present invention.
Figure 10B:
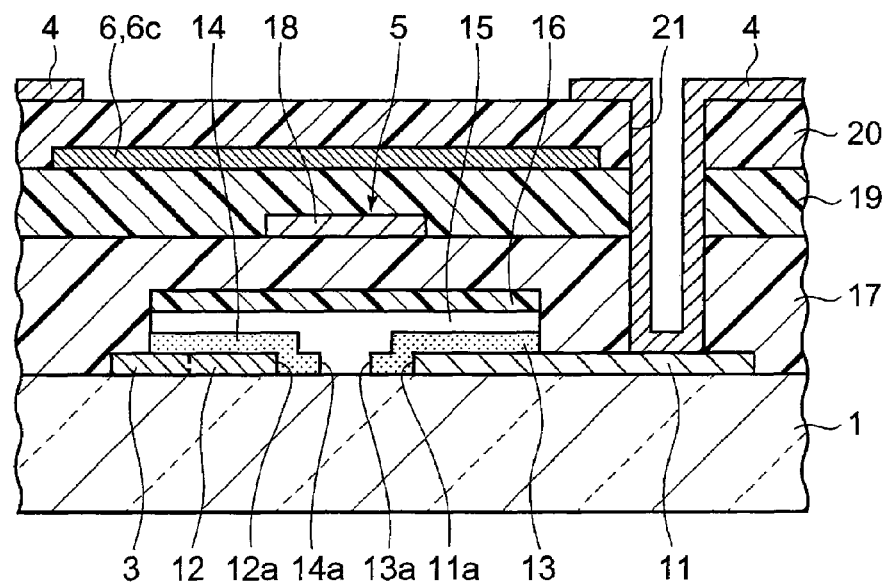
FIG. 10B is a cross-sectional view as sectioned along a line X$_B$-X$_B$ of FIG. 10A.

FIG. 10A shows a see-through plan view of a principal part of a liquid crystal display device comprising a thin film transistor, as the second embodiment of the present invention. FIG. 10B shows a cross sectional view as sectioned along line $X_B$-$X_B$ of FIG. 10A. The difference between the present liquid crystal display device and the liquid crystal display device shown in FIG. 2A and FIG. 2B is that one ohmic contact layer 13 is formed at a predetermined position on the upper surface of the source electrode 11 at a side closer to the drain electrode 12 and on the neighboring upper surface of the glass substrate 1, and the other ohmic contact layer 14 is formed at a predetermined position on the upper surface of the drain electrode 12 including a part of the data line 3 at a side closer to the source electrode 11 and on the neighboring upper surface of the glass substrate 1. That is, the ohmic contact layers 13 and 14 are formed on the upper surfaces of the source electrode 11 and drain electrode 12 respectively, so as to have their facing end surfaces 13a and 14a protrude from the facing end surfaces 11a and 12a of the source electrode 11 and drain electrode 12.

Figure 11A:
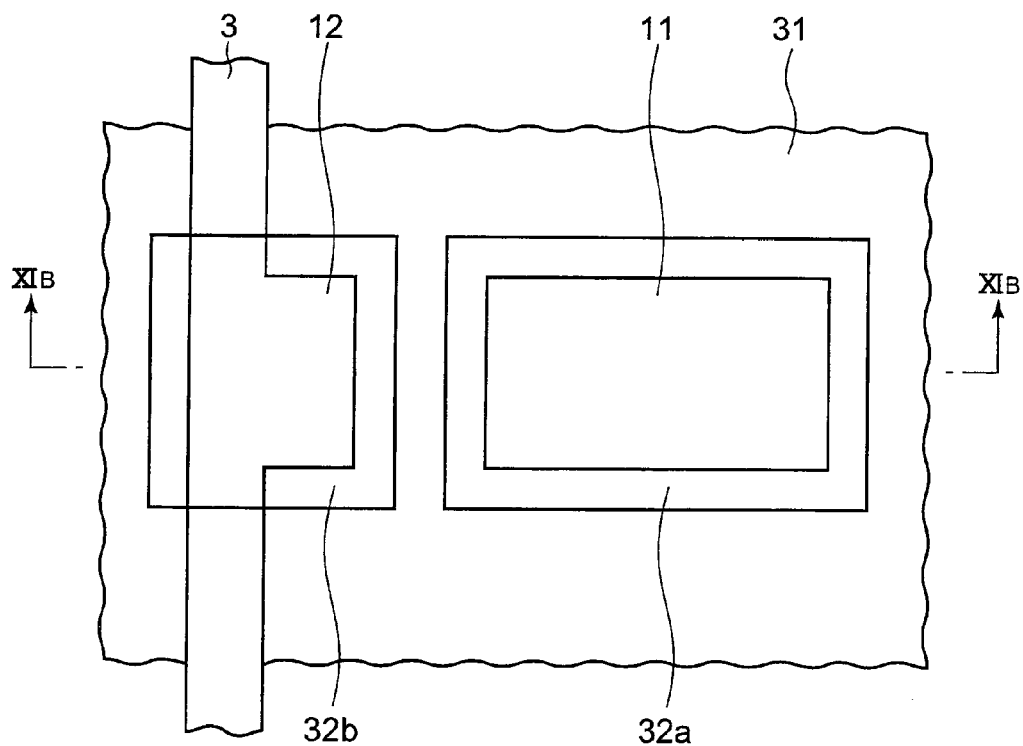
FIG. 11A is a see-through plan view showing an earlier step of a process for manufacturing the part of the thin film transistor shown in FIGS. 10A and 10B.
Figure 11B:
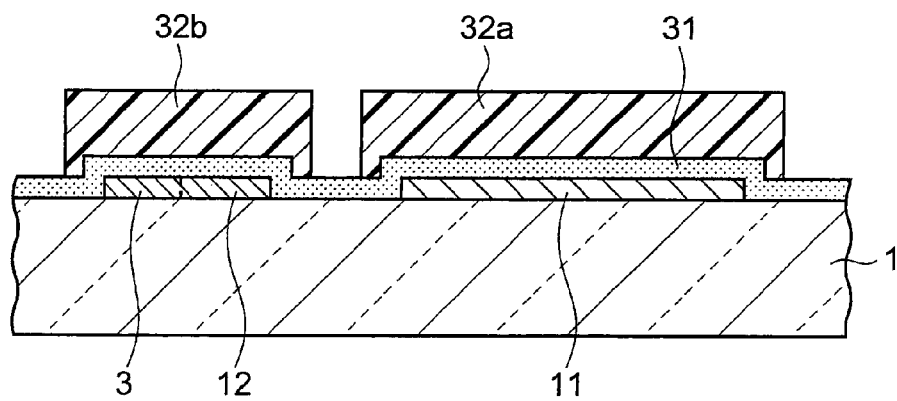
FIG. 11B is a cross-sectional view as sectioned along a line XI$_B$-XI$_B$ of FIG. 11A.

Next, one example of a manufacturing method of a region around the thin film transistor 5 in the present liquid crystal display device will be explained. First, the source electrode 11, the drain electrode 12, and the data line 3 connected to the drain electrode 12 are formed on respective predetermined positions on the upper surface of the glass substrate 1, as shown in FIG. 11A and FIG. 11B, by photolithographically patterning a metal film made of aluminum, chromium, ITO, or the like formed by sputtering.

Next, a first ohmic contact layer forming layer 31 made of n type zinc oxide is formed on the upper surface of the glass substrate 1, including on the source electrode 11, the drain electrode 12, and the data line 3, by facing-target sputtering. Next, resist patterns 32a and 32b are formed on respective predetermined positions on the upper surface of the first ohmic contact layer forming layer 31, by photolithography.

In this case, one resist pattern 32a is formed to be larger than the source electrode 11 by some degree in order to fully cover the source electrode 11. The other resist pattern 32b is formed to be larger than the drain electrode 12 including a part of the data line 3 by some degree so as to fully cover the drain electrode 12 including the part of the data line 3.

The resist patterns 32a and 32b are formed as described above, because, to explain with reference to FIG. 10A and FIG. 10B, the interval between the end surface 11a of the source electrode 11 and the end surface 13a of the one ohmic contact layer 13 is the margin for keeping these end surfaces 11a and 13a at a desired positional relation and needs generally to be 1 to 4 μm, though might vary depending on process accuracy.

Figure 12A:
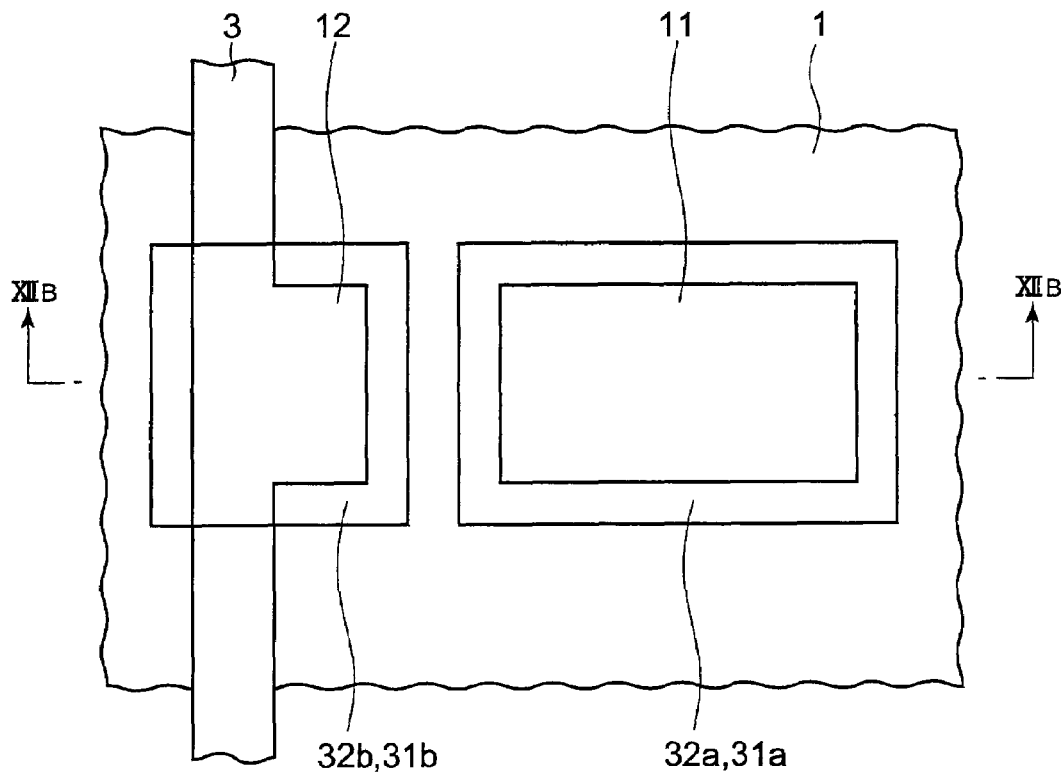
FIG. 12A is a see-through plan view of a step succeeding FIGS. 11A and 11B.
Figure 12B:
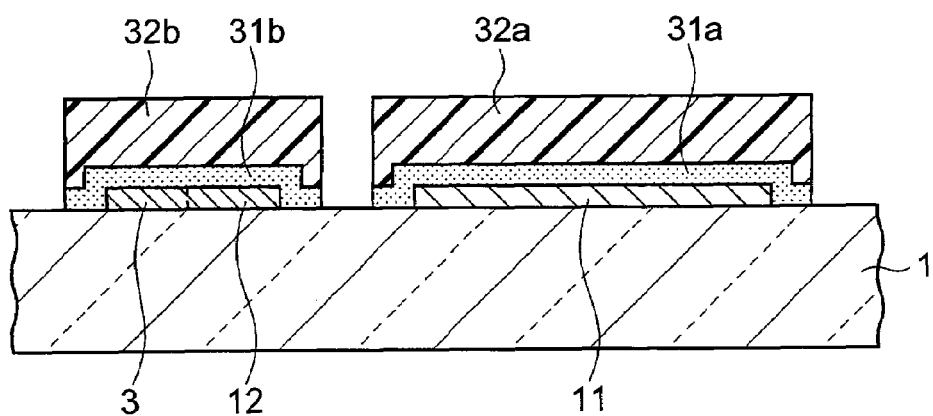
FIG. 12B is a cross-sectional view as sectioned along a line XII$_B$-XII$_B$ of FIG. 12A.

Next, the first ohmic contact layer forming layer 31 is etched by using the resist patterns 32a and 32b as masks, to form second ohmic contact layer forming layers 31a and 31b under the resist patterns 32a and 32b as shown in FIG. 12A and FIG. 12B. In this case, since the first ohmic contact layer forming layer 31 is made of n type zinc oxide, the process controllability can be fine if the above-described sodium hydroxide is used as the etching liquid.

Next, the resist pattern 32a and 32b are separated by using a resist separation liquid. In this case, the surfaces of the second ohmic contact layer forming layers 31a and 31b are exposed. Thus, a resist separation liquid showing neither acidity nor alkalinity (including no electrolyte), for example, a single organic solvent (for example, dimethylsulfoxide (DMSO)), is used.

Figure 13A:
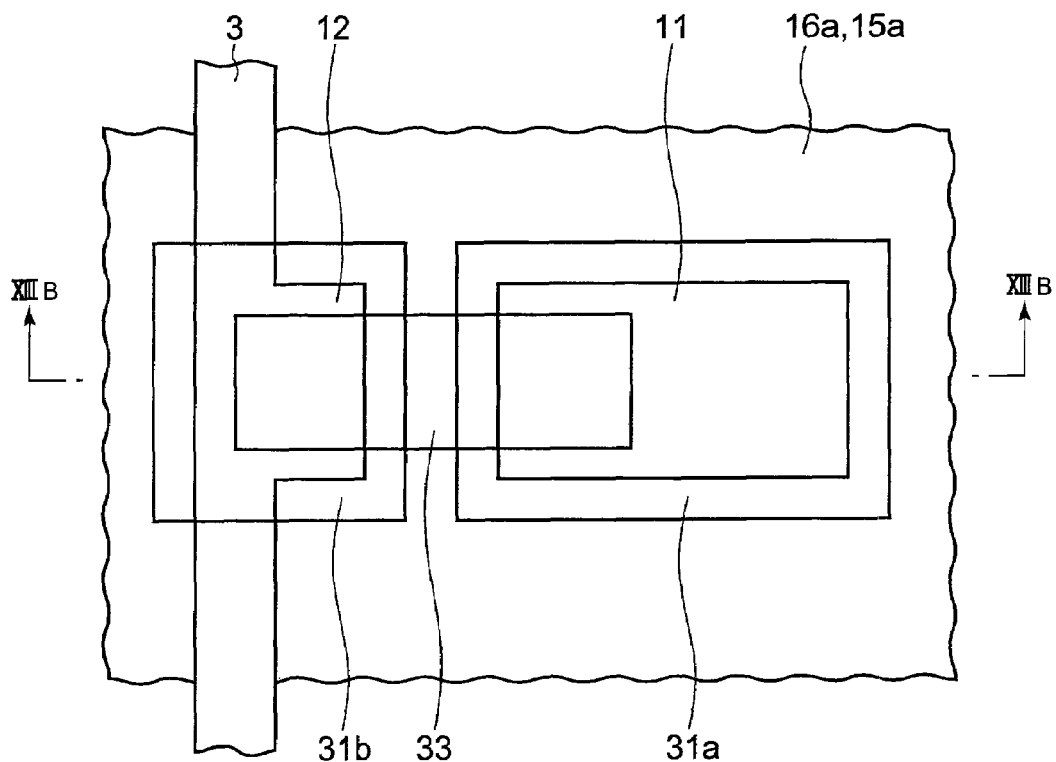
FIG. 13A is a see-through plan view of a step succeeding FIGS. 12A and 12B.
Figure 13B:
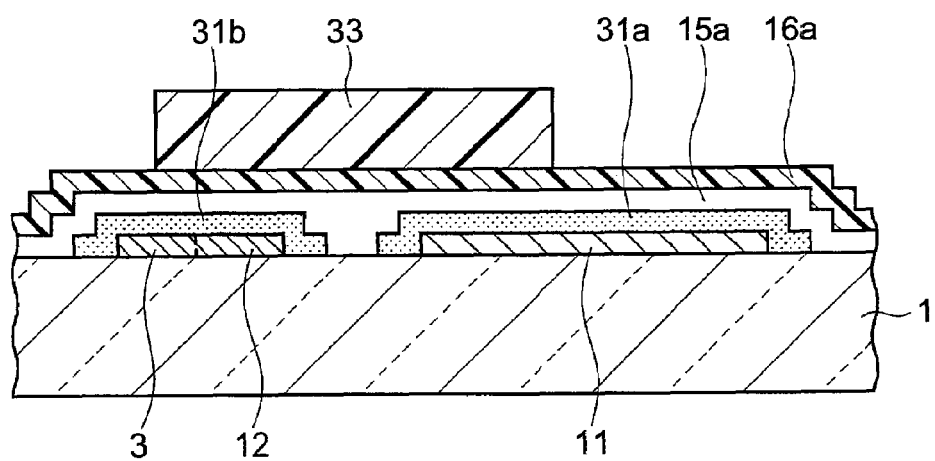
FIG. 13B is a cross-sectional view as sectioned along a line XIII$_B$-XIII$_B$ of FIG. 13A.

Next, as shown in FIG. 13A and FIG. 13B, a semiconductor thin film forming film 15a made of intrinsic zinc oxide and a protection film forming film 16a made of silicon nitride are continuously formed by plasma CVD on the upper surface of the glass substrate 1, including on the second ohmic contact layer forming layers 31a and 31b and the data line 3. Next, a resist pattern 33 for forming a device area is formed by photolithography at a predetermined position on the upper surface of the protection film forming film 16a.

Figure 14A:
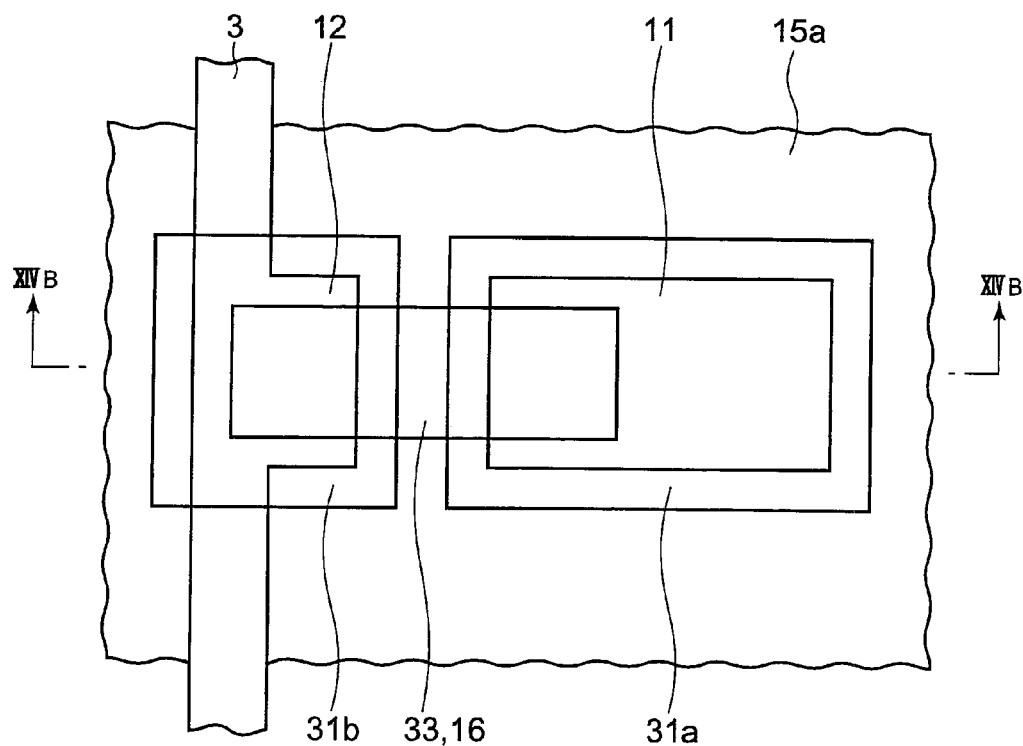
FIG. 14A is a see-through plan view of a step succeeding FIGS. 13A and 13B.
Figure 14B:
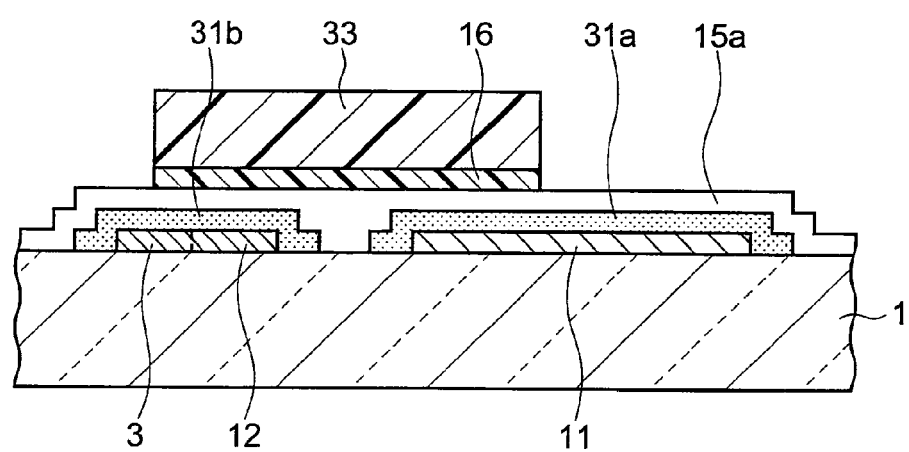
FIG. 14B is a cross-sectional view as sectioned along a line XIV$_B$-XIV$_B$ of FIG. 14A.

Next, the protection film forming film 16a is etched by using the resist pattern 33 as a mask, to form the protection film 16 under the resist pattern 33 as shown in FIG. 14A and FIG. 14B. In this case, the surface of the semiconductor thin film forming film 15a, except under the resist pattern 33 is exposed. Accordingly, reactive plasma etching (dry etching) using sulferhexafluoride ($SF_6$) is preferable as the etching method for forming the protection film 16 made of silicon nitride.

Next, the resist pattern 33 is separated by using a resist separation liquid. In this case, the surface of the semiconductor thin film forming film 15a except under the protection film 16 is exposed to the resist separation liquid, but there will be no trouble because the exposed surface is not the device area. That is, the semiconductor thin film forming film 15a under the protection film 16 is protected by the protection film 16. In this case, a resist separation liquid showing neither acidity nor alkalinity (including no electrolyte), such as a single organic solvent (for example, dimethylsulfoxide (DMSO)) may be used.

Figure 15A:
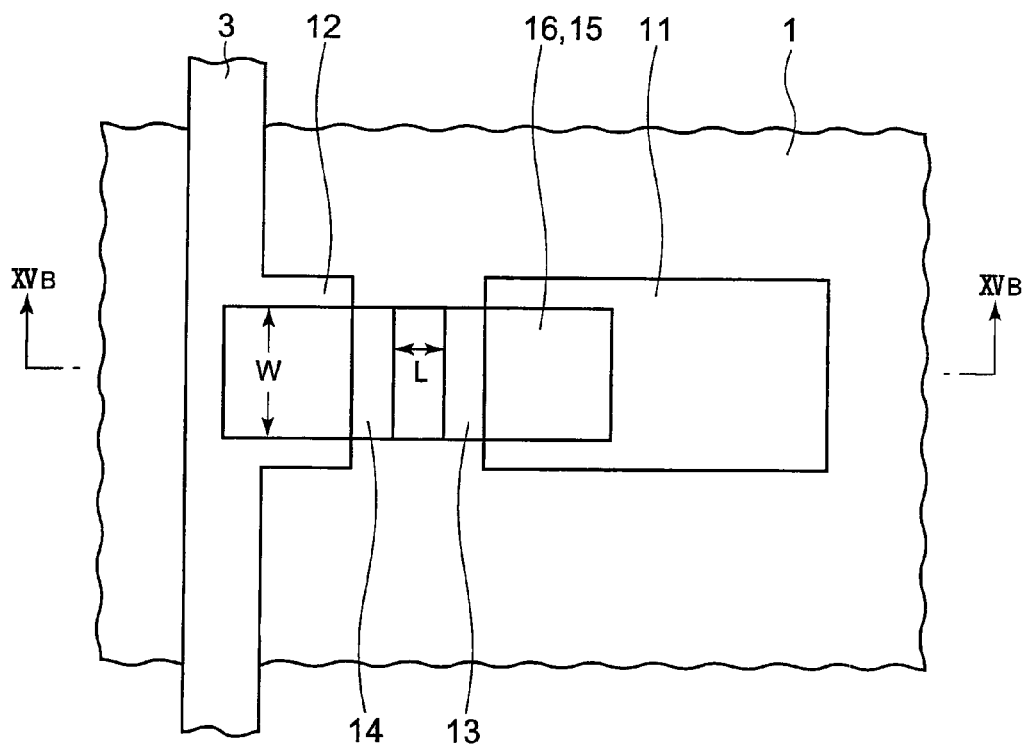
FIG. 15A is a see-through plan view of a step succeeding FIGS. 14A and 14B.
Figure 15B:
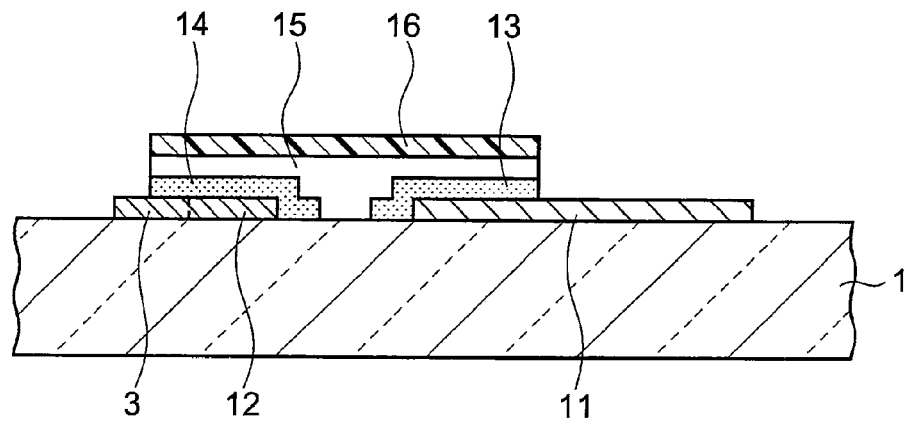
FIG. 15B is a cross-sectional view as sectioned along a line XV$_B$-XV$_B$ of FIG. 15A.

Next, the semiconductor thin film forming film 15a and the second ohmic contact layer forming layers 31a and 31b are continuously etched by using the protection film 16 as a mask, to form the semiconductor thin film 15 under the protection film 16, and the ohmic contact layers 13 and 14 at both sides under the semiconductor thin film 15, as shown in FIG. 15A and FIG. 15B.

In this case, since the semiconductor thin film forming film 15a and the second ohmic contact layer forming layers 31a and 31b are made of intrinsic zinc oxide and n type zinc oxide, the process controllability can be fine if the above-described sodium hydroxide aqueous solution is used as the etching liquid. Here, the interval between the end surfaces 13a and 14a of the two ohmic contact layers 13 and 14 is the channel length L, and the dimension of the ohmic contact layers 13 and 14 in the direction perpendicular to the channel length L is the channel width W. Hereafter, the similar manufacturing steps to those of the first embodiment are gone through to obtain the liquid crystal display device shown in FIG. 10A and FIG. 10B.

Third Embodiment

Figure 16A:
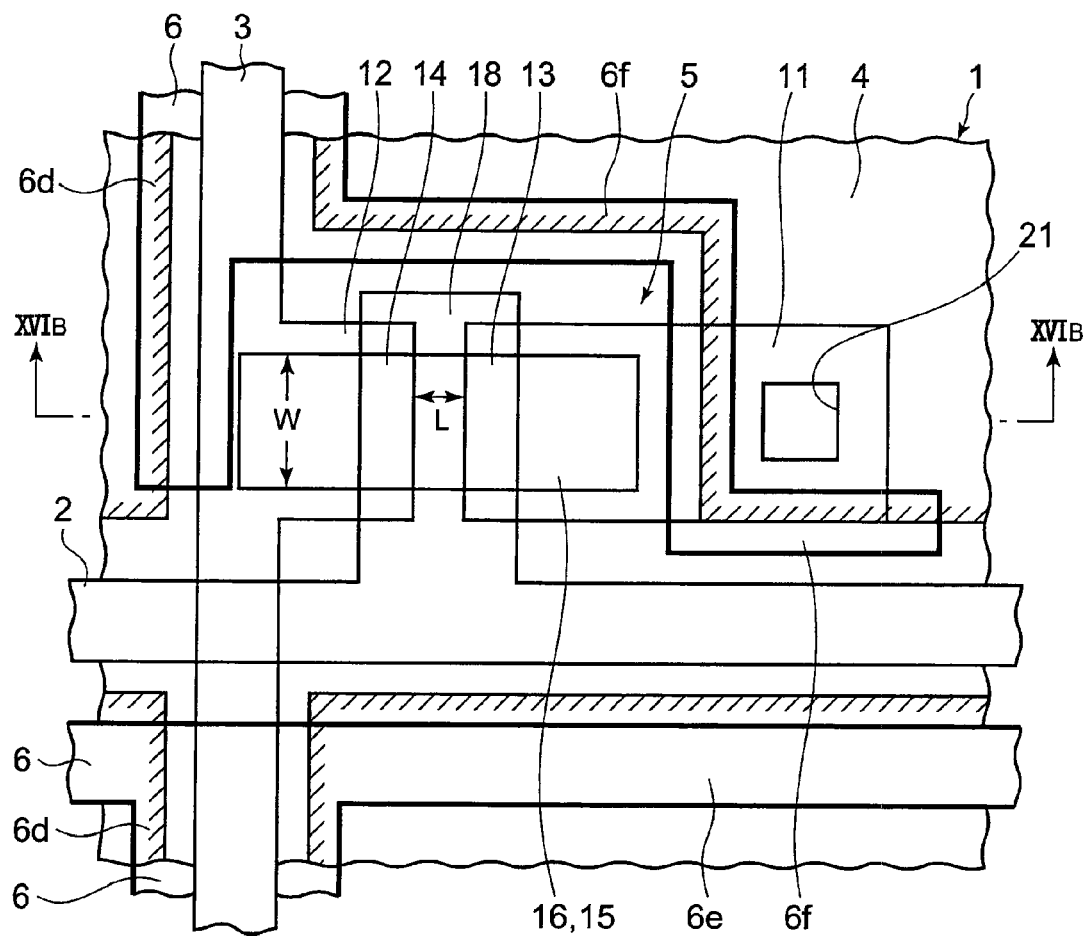
FIG. 16A is a see-through plan view of a principal part of a liquid crystal display device having a thin film transistor, as a third embodiment of the present invention.
Figure 16B:
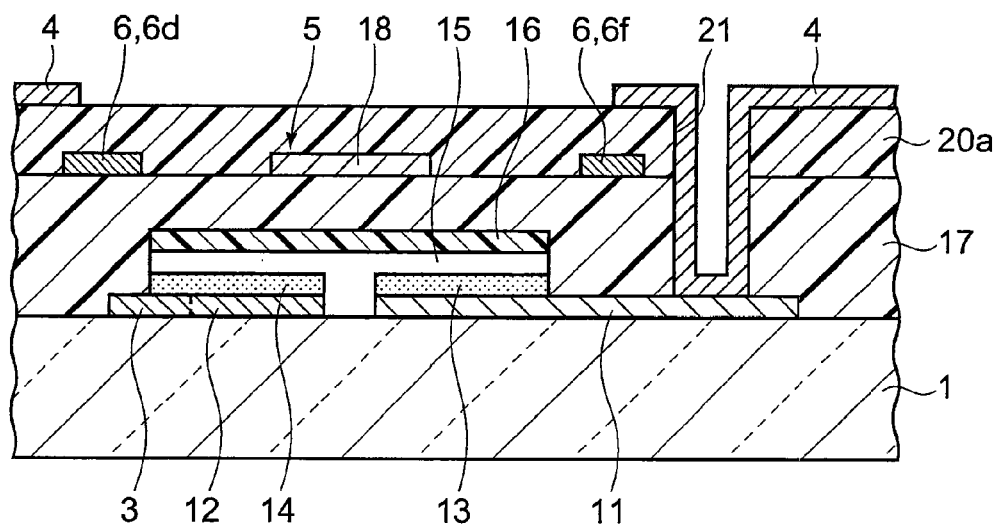
FIG. 16B is a cross-sectional view as sectioned along a line XVI$_B$-XVI$_B$ of FIG. 16A.

FIG. 16A shows a see-through plan view of a principal part of a liquid crystal display device comprising a thin film transistor, as the third embodiment of the present invention. FIG. 16B shows a cross-sectional view as sectioned along a line $XVI_B$-$XVI_B$ of FIG. 16A. The difference between the present liquid crystal display device and the liquid crystal display device shown in FIG. 2A and FIG. 2B is that no upper insulating film 19 is formed but the gate electrode 18, the scanning line 2 connected to the gate electrode 18, and the auxiliary capacitor electrode 6, which are made of a light blocking metal such as aluminum, chromium, etc., are formed at respective predetermined positions on the upper surface of the insulating film 17, and the gate electrode 18, the scanning line 2, and the auxiliary capacitor electrode 6 are covered with the overcoat film (insulating film) 20a.

In this case, the auxiliary capacitor electrode 6 comprises a first auxiliary capacitor electrode portion 6d including a region overlapping a part of the data line 3, a second auxiliary capacitor electrode portion 6e arranged near the scanning line 2 in parallel with the scanning line 2, and a third auxiliary capacitor electrode portion 6f arranged along a predetermined edge of the pixel electrode 4. To make the plan-view shape of the auxiliary capacitor electrode 16 clear, the edges of the auxiliary capacitor electrode 16 are drawn by bolder solid lines than those for the other components.

According to a manufacturing method of a region around the thin film transistor 5 of the present liquid crystal display device, it is possible to simultaneously form the gate electrode 18, the scanning line 2 connected to the gate electrode 18, and the auxiliary capacitor electrode 6, which are made of a light blocking metal such as aluminum, chromium, etc. at the respective predetermined positions on the upper surface of the insulating film 17. Therefore, as compared with the case shown in FIG. 2A and FIG. 2B, it is possible to omit the step of forming the upper insulating film, the step of forming an auxiliary capacitor electrode forming film, the step of forming a resist pattern for forming the auxiliary capacitor electrode, the step of forming the auxiliary capacitor electrode by etching the auxiliary capacitor electrode forming film by using the resist pattern as a mask, and the step of separating the resist pattern, enabling the number of manufacturing steps to be reduced.

Other Embodiments

The semiconductor thin film forming film 15a and the ohmic contact layer forming layer 31 may be formed not only by plasma CVD, but by sputtering, vapor deposition, casting, plating, etc. The ohmic contact layers 13 and 14 may be not only made of n type zinc oxide, but of p type zinc oxide, and further, of zinc oxide whose conductivity has been altered by an oxygen vacancy.

A base insulating film may be formed between the glass substrate 1, and the source electrode 11 and drain electrode 12. In a case where the base insulating film is made of, for example, an ion barrier material, it is possible to reduce impurity diffusion from the glass substrate 1 and to suppress reaction of the glass substrate 1 with the zinc oxide film. In a case where a material having similar lattice constant and crystalline structure to those of zinc oxide is selected as the material of the base insulating film, it is possible to improve the crystallinity of the zinc oxide film.

According to the present invention, it is possible to improve the process accuracy, by forming a protection film on entirely the upper surface of the semiconductor thin film made of intrinsic zinc oxide, that is, by protecting the semiconductor thin film forming film made of intrinsic zinc oxide, that is under the protection film, with the protection film when separating the resist pattern for forming the protection film on the upper surface of the semiconductor thin film forming film, then forming the semiconductor thin film under the protection film by etching the semiconductor thin film forming film by using the protection film as the mask, and leaving the protection film on the entire upper surface of the semiconductor thin film.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2005-170348 filed on Jun. 10, 2005 and including specification, claims, drawings and summary. The disclosure of the above Japanese Patent Application is incorporated herein by reference in its entirety.

What is claimed is:

1. A method of manufacturing a thin film transistor, comprising:
   continuously forming a semiconductor thin film forming film including zinc oxide and a protection film forming film;
   forming a protection film by etching the protection film forming film;
   forming a semiconductor thin film having a substantially same plan-view shape as the protection film, by etching the semiconductor thin film forming film by using the protection film as a mask;
   forming a gate insulating film which covers the protection film; and
   forming a gate electrode on the gate insulating film.

2. The method according to claim 1,
   wherein etching of the protection film forming film is reactive plasma etching.

3. The method according to claim 2,
   wherein the reactive plasma etching is performed by using a reaction gas containing sulferhexafluoride.

4. The method according to claim 1,
   wherein etching of the semiconductor thin film forming film is performed by using an etching liquid containing sodium hydroxide aqueous solution.

5. The method according to claim 1,
   wherein a source electrode and a drain electrode are formed before the semiconductor thin film forming film containing zinc oxide and the protection film forming film are continuously formed.

6. The method according to claim 5,
   wherein a plurality of ohmic contact layer forming layers made of a material including zinc oxide are formed on the source electrode and the drain electrode.

7. The method according to claim 6,
   wherein the ohmic contact layer forming layers are etched using an etching liquid including an alkaline aqueous solution.

8. The method according to claim 6,
   wherein after the semiconductor thin film having the plan-view shape is formed, a plurality of ohmic contact layers are formed by etching the ohmic contact layer forming layers by using the protection film as a mask.

9. The method according to claim 8,
   wherein etching of the ohmic contact layer forming layers is performed by using an etching liquid containing sodium hydroxide aqueous solution.

10. The method according to claim 1,
    wherein an upper insulating film is formed on the gate electrode.

11. The method according to claim 10,
    wherein an auxiliary capacitor electrode is formed on the upper insulating film.

12. The method according to claim 11,
    wherein the auxiliary capacitor electrode is formed so as to substantially entirely cover the semiconductor thin film.

13. The method according to claim 12,
    wherein an overcoat film is formed on the auxiliary capacitor electrode.

14. The method according to claim 13,
    wherein a pixel electrode electrically connected to the source electrode is formed on the overcoat film.

15. The method according to claim 14,
    wherein forming the pixel electrode comprises forming a contact hole that penetrates through the overcoat film, the upper insulating film, and the gate insulating film to expose a part of the source electrode.

16. The method according to claim 1,
wherein an auxiliary capacitor electrode electrically insulated from the gate electrode is formed on the gate insulating film.

17. The method according to claim 16,
wherein an overcoat film is formed on the gate insulating film and the gate electrode.

18. The method according to claim 17,
wherein a pixel electrode connected to the source electrode is formed on the overcoat film.

19. The method according to claim 18,
wherein forming the pixel electrode comprises exposing a part of the source electrode by penetrating the gate electrode and the overcoat film.

* * * * *